(12) United States Patent
Zeng

(10) Patent No.: US 12,185,603 B2
(45) Date of Patent: Dec. 31, 2024

(54) DISPLAY PANEL, MANUFACTURING METHOD THEREOF, AND DISPLAY DEVICE

(71) Applicant: TCL CHINA STAR OPTOELECTRONICS TECHNOLOGY CO., LTD., Guangdong (CN)

(72) Inventor: Weijing Zeng, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 597 days.

(21) Appl. No.: 17/600,163

(22) PCT Filed: Jun. 4, 2021

(86) PCT No.: PCT/CN2021/098357
§ 371 (c)(1),
(2) Date: Sep. 30, 2021

(87) PCT Pub. No.: WO2022/246900
PCT Pub. Date: Dec. 1, 2022

(65) Prior Publication Data
US 2022/0384559 A1     Dec. 1, 2022

(30) Foreign Application Priority Data

May 27, 2021 (CN) .......................... 202110585829.2

(51) Int. Cl.
*H01L 21/78* (2006.01)
*H10K 59/122* (2023.01)
(Continued)

(52) U.S. Cl.
CPC ....... *H10K 59/1315* (2023.02); *H10K 59/122* (2023.02); *H10K 71/00* (2023.02); *H10K 59/1201* (2023.02)

(58) Field of Classification Search
CPC .. H10K 59/1315; H10K 59/122; H10K 71/00; H10K 59/1201; H10K 50/822;
(Continued)

(56) References Cited

U.S. PATENT DOCUMENTS 9,859,520 B2 *   1/2018   Kim ..................... H10K 59/131
10,177,206 B2 *  1/2019   Jung ................... H10K 50/822
(Continued)

*Primary Examiner* — Vu A Vu
(74) *Attorney, Agent, or Firm* — Rivka Friedman

(57) ABSTRACT

A display panel, a manufacturing method thereof, and a display device are provided. In the display panel, a first undercut structure and a second undercut structure are formed along a vertical direction of an overlappingly connecting hole of the first electrode layer and the auxiliary electrode layer. Therefore, an overlappingly connecting area between the first electrode layer and the auxiliary electrode layer can be enlarged. As such, the first electrode layer can be ensured to have high transparency and good conductivity, thereby solving an issue of IP drop of the first electrode. In addition, by using this undercut structure as well as using a metal line layer to overlappingly connect the first electrode layer with the auxiliary electrode layer, the overlappingly connecting area between the first electrode layer and the auxiliary electrode layer can be enlarged without reducing an aperture ratio of the display panel.

20 Claims, 8 Drawing Sheets

(51) Int. Cl.
  *H10K 59/131*  (2023.01)
  *H10K 71/00*   (2023.01)
  *H10K 59/12*   (2023.01)

(58) Field of Classification Search
  CPC .. H10K 50/865; H10K 50/828; H10K 59/131; H10K 2102/3026; H10K 71/861; G09F 9/30; H05B 33/12; H05B 33/22; H05B 33/28
  USPC .......................................................... 257/40
  See application file for complete search history.

(56) References Cited

U.S. PATENT DOCUMENTS

| | | | |
|---|---|---|---|
| 10,388,905 B2 * | 8/2019 | Choi | H10K 50/824 |
| 10,418,430 B2 * | 9/2019 | Choi | H10K 50/814 |
| 10,591,787 B2 * | 3/2020 | Shim | H01L 27/14636 |
| 10,692,947 B2 * | 6/2020 | Kim | H10K 59/1213 |
| 10,756,293 B2 * | 8/2020 | Lee | H10K 59/124 |
| 11,430,840 B2 * | 8/2022 | Kang | H10K 71/00 |
| 11,770,952 B2 * | 9/2023 | You | H10K 71/00 |

* cited by examiner

DISPLAY PANEL, MANUFACTURING METHOD THEREOF, AND DISPLAY DEVICE

FIELD

The present disclosure relates to a field of display technologies, and more particularly, to a display panel, a manufacturing thereof, and a display device.

BACKGROUND

Organic light-emitting diodes (OLEDs) have attracted wide attention because they have multiple properties such as self-luminescence, high brightness, wide viewing angles, flexibility, low power consumption, etc. As a new-generation display method, OLEDs have gradually replaced liquid crystal displays (LCDs) and have been widely used in cell phone panels, computer display devices, color televisions, etc. Top-emitting OLEDs are a selection of high-resolution television products in the future. A requirement for cathodes of the top-emitting OLEDs is extremely high. The cathodes not only need to have high transparency, but also need to have good conductivity and low IR drop. In conventional top-emitting OLEDs, cathodes are usually made of an entire surface of an Mg/Ag material. Although Mg/Ag have a work function matching an organic material, they cannot realize high transparency and good conductivity. This is because the thicker a metal layer, the worse the conductivity. Nowadays, to solve an IR drop issue in large-scale panels, an auxiliary cathode is commonly used in an industry. A surface of a cathode is overlappingly connected to an auxiliary cathode by an auxiliary cathode connecting hole, thereby realizing a parallel connection between the surface of the cathode and the auxiliary cathode line. As such, an electrical resistance of the cathode of OLEDs can be reduced. However, in this method, an area of the auxiliary cathode hole is commonly enlarged to reduce an electrical resistance of overlapping connection, which occupies space for pixels and reduces a pixel aperture ratio.

SUMMARY

The present disclosure provides a display panel, a manufacturing method thereof, and a display device, which can prevent an aperture ratio of display panels from being affected and solve an issue of IR drop.

The present disclosure provides a display panel, comprising:
an array substrate;
an auxiliary electrode layer disposed on the array substrate;
a passivation layer disposed on a side of the auxiliary electrode layer away from the array substrate, wherein a first through-hole is defined on the passivation layer;
a planarization layer disposed on a side of the passivation layer away from the auxiliary layer, wherein a first connecting hole is defined on the planarization layer and is connected to the first through-hole;
a metal line layer disposed on a side of the planarization layer away from the passivation layer and extending into the first connecting hole, wherein a first undercut structure is formed at a contact area between the metal line layer and the passivation layer near the first connecting hole;
a pixel-defining layer disposed on a side of the planarization layer away from the passivation layer, wherein a first via is defined on the pixel-defining layer, the first via is connected to the first connecting hole, a second undercut structure is formed at a contact area between the pixel-defining layer and the metal line layer, and the second undercut structure is formed on an extending surface of a lateral wall of the first connecting hole; and
a first electrode layer disposed on a side of the pixel-defining layer away from the planarization layer, wherein the first electrode layer comprises a first sub-electrode layer and a second sub-electrode layer, the first electrode layer is embedded into the first undercut structure by the first via, the first connecting hole, and the first through-hole and is connected to the auxiliary electrode layer, and the second sub-electrode layer is embedded into the second undercut structure by the first via and the first connecting hole and is connected to the metal line layer.

Optionally, in some embodiments of the present disclosure, a ratio of a height of the first undercut structure to a width of the first undercut structure is below 0.7, and a ratio of a height of the second undercut structure to a width of the second undercut structure is below 0.7.

Optionally, in some embodiments of the present disclosure, a second through-hole is defined on the passivation layer, a second connecting hole is defined on the planarization layer, the second connecting hole is connected to the second through-hole, and the metal line layer is connected to the auxiliary electrode layer by the second connecting hole and the second through-hole.

Optionally, in some embodiments of the present disclosure, an electrical resistance of the metal line layer is less than an electrical resistance of the first electrode layer.

Optionally, in some embodiments of the present disclosure, a thickness of the metal line layer ranges from 1500 Å to 8000 Å.

Optionally, in some embodiments of the present disclosure, the display panel comprises a source/drain metal layer, a second electrode layer, and a luminescent functional layer, a third connecting hole is defined on the passivation layer and the planarization layer, the third connecting hole extends from a side of the source/drain metal layer away from the array substrate to a side of the planarization layer away from the array substrate, a second via is defined on the pixel-defining layer; and
the source/drain metal layer and the auxiliary electrode layer are disposed on a same layer, the second electrode layer and the metal line layer are disposed on a same layer, the second electrode layer is connected to the source/drain metal layer by the third connecting hole, the luminescent functional layer is disposed on a side of the pixel-defining layer away from the array substrate, the luminescent functional layer is connected to the auxiliary electrode layer by the first through-hole, the first connecting hole, and the first via, the luminescent functional layer is connected to the second electrode layer by the second via, and the first electrode layer is disposed on a side of the luminescent functional layer away from the pixel-defining layer.

Correspondingly, the present disclosure further provides a method of manufacturing a display panel, comprising following steps:
forming an auxiliary electrode layer on an array substrate;
forming a passivation layer on a side of the auxiliary electrode layer away from the array substrate;
forming a planarization layer on a side of the passivation layer away from the auxiliary electrode layer;
forming a first connecting hole on the planarization layer;

forming a metal line layer on a side of the planarization layer away from the passivation layer, wherein the metal line layer extends into the first connecting hole;

forming a sacrificial layer on a side of the metal line layer away from the array substrate;

forming a pixel-defining layer on a side of the planarization layer away from the passivation layer, and forming a first via on the pixel-defining layer, wherein the first via is connected to the first connecting hole;

forming a first via on the pixel-defining layer, wherein the first via is connected to the first connecting hole;

forming a first through-hole on the passivation layer, wherein the first connecting hole is connected to the first through-hole;

forming a first undercut structure at a contact area between the metal line layer and the passivation layer near the first connecting hole, wherein the first undercut structure is formed along a lateral wall of the first through-hole;

etching the sacrificial layer, and forming a second undercut structure at a contact area between the pixel-defining layer and the metal line layer, wherein the second undercut structure is formed on an extending surface of a lateral wall of the first connecting hole; and forming a first electrode layer on a side of the pixel-defining layer away from the planarization layer, wherein the first electrode layer comprises a first sub-electrode layer and a second sub-electrode layer, the first sub-electrode layer is connected to the auxiliary electrode layer by the first through-hole and the first undercut structure, and the second sub-electrode layer is connected to the metal line layer by the second undercut structure.

Optionally, in some embodiments of the present disclosure, the step of forming the first connecting hole on the planarization layer comprises the following steps: forming a second connecting hole on the planarization layer, and forming a second through-hole on the passivation layer, wherein the second connecting hole is connected to the second through-hole; and wherein the metal line layer is connected to the auxiliary electrode layer by the second connecting hole and the second through-hole.

Optionally, comprising the following steps:

when the auxiliary electrode layer is formed on the array substrate, forming a source/drain metal layer on a same layer; and when the metal line layer is formed on the side of the planarization layer away from the passivation layer, forming a second electrode layer on a same layer.

Optionally, in some embodiments of the present disclosure, the step of forming the first undercut structure at the contact area between the metal line layer and the passivation layer near the first connecting hole comprises following steps:

forming a photoresist layer on a side of the planarization layer away from the array substrate, a side of the pixel-defining layer away from the array substrate, a side of the metal line layer away from the array substrate, and a side of the second electrode layer away from the substrate, wherein the photoresist layer exposes the first connecting hole;

performing a first etching step on the passivation layer below the first connecting hole, thereby forming the first undercut structure at the contact area of the metal line layer near the first connecting hole; and removing the photoresist layer.

Optionally, in some embodiments of the present disclosure, the step of forming the second undercut structure at the contact area between the pixel-defining layer and the metal line layer comprises:

forming a photoresist layer on a side of the planarization layer away from the array substrate, a side of the pixel-defining layer away from the array substrate, a side of the metal line layer away from the array substrate, and a side of the second electrode layer away from the substrate, wherein the photoresist layer exposes the sacrificial layer;

performing a second etching step on the sacrificial layer, thereby forming the second undercut structure at the contact area between the pixel-defining layer and the metal line layer; and removing the photoresist layer.

Optionally, in some embodiments of the present disclosure, an etchant used in the first etching step is hydrogen fluoride, and an etchant used in the second etching step is one or more of oxalic acid, copper acid, and aluminum acid.

Optionally, in some embodiments of the present disclosure, the first electrode layer is disposed on the side of the pixel-defining layer away from the planarization layer by evaporation.

Optionally, in some embodiments of the present disclosure, an evaporation angle of evaporation ranges from 40° to 85°.

Correspondingly, the present disclosure further provides a display device, comprising a display panel, wherein the display panel comprises:

an array substrate;

an auxiliary electrode layer disposed on the array substrate;

a passivation layer disposed on a side of the auxiliary electrode layer away from the array substrate, wherein a first through-hole is defined on the passivation layer;

a planarization layer disposed on a side of the passivation layer away from the auxiliary layer, wherein a first connecting hole is defined on the planarization layer and is connected to the first through-hole;

a metal line layer disposed on a side of the planarization layer away from the passivation layer and extending into the first connecting hole, wherein a first undercut structure is formed at a contact area between the metal line layer and the passivation layer near the first connecting hole;

a pixel-defining layer disposed on a side of the planarization layer away from the passivation layer, wherein a first via is defined on the pixel-defining layer, the first via is connected to the first connecting hole, a second undercut structure is formed at a contact area between the pixel-defining layer and the metal line layer, and the second undercut structure is formed on an extending surface of a lateral wall of the first connecting hole; and a first electrode layer disposed on a side of the pixel-defining layer away from the planarization layer, wherein the first electrode layer comprises a first sub-electrode layer and a second sub-electrode layer, the first electrode layer is embedded into the first undercut structure by the first via, the first connecting hole, and the first through-hole and is connected to the auxiliary electrode layer, and the second sub-electrode layer is embedded into the second undercut structure by the first via and the first connecting hole and is connected to the metal line layer.

Optionally, in some embodiments of the present disclosure, a ratio of a height of the first undercut structure to a width of the first undercut structure is below 0.7, and a ratio of a height of the second undercut structure to a width of the second undercut structure is below 0.7.

Optionally, in some embodiments of the present disclosure, a second through-hole is defined on the passivation layer, a second connecting hole is defined on the planarization layer, the second connecting hole is connected to the second through-hole, and the metal line layer is connected to the auxiliary electrode layer by the second connecting hole and the second through-hole.

Optionally, in some embodiments of the present disclosure, an electrical resistance of the metal line layer is less than an electrical resistance of the first electrode layer.

Optionally, in some embodiments of the present disclosure, a thickness of the metal line layer ranges from 1500 Å to 8000 Å.

Optionally, in some embodiments of the present disclosure, the display panel comprises a source/drain metal layer, a second electrode layer, and a luminescent functional layer, a third connecting hole is defined on the passivation layer and the planarization layer, the third connecting hole extends from a side of the source/drain metal layer away from the array substrate to a side of the planarization layer away from the array substrate, a second via is defined on the pixel-defining layer; and the source/drain metal layer and the auxiliary electrode layer are disposed on a same layer, the second electrode layer and the metal line layer are disposed on a same layer, the second electrode layer is connected to the source/drain metal layer by the third connecting hole, the luminescent functional layer is disposed on a side of the pixel-defining layer away from the array substrate, the luminescent functional layer is connected to the auxiliary electrode layer by the first through-hole, the first connecting hole, and the first via, the luminescent functional layer is connected to the second electrode layer by the second via, and the first electrode layer is disposed on a side of the luminescent functional layer away from the pixel-defining layer.

Regarding the beneficial effects: by forming a first undercut structure and a second undercut structure along a vertical direction of an overlappingly connecting hole of a first electrode layer and an auxiliary electrode layer, an overlappingly connecting area between the first electrode layer and the auxiliary electrode layer can be enlarged. As such, the first electrode layer can be ensured to have high transparency and good conductivity, and an issue of IR drop of a first electrode can be solved. Furthermore, by using this undercut structure as well as using a metal line layer to overlappingly connect the first electrode layer with the auxiliary electrode layer, the overlappingly connecting area between the first electrode layer and the auxiliary electrode layer can be enlarged without reducing an aperture ratio of display panels.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION

Figure 1:
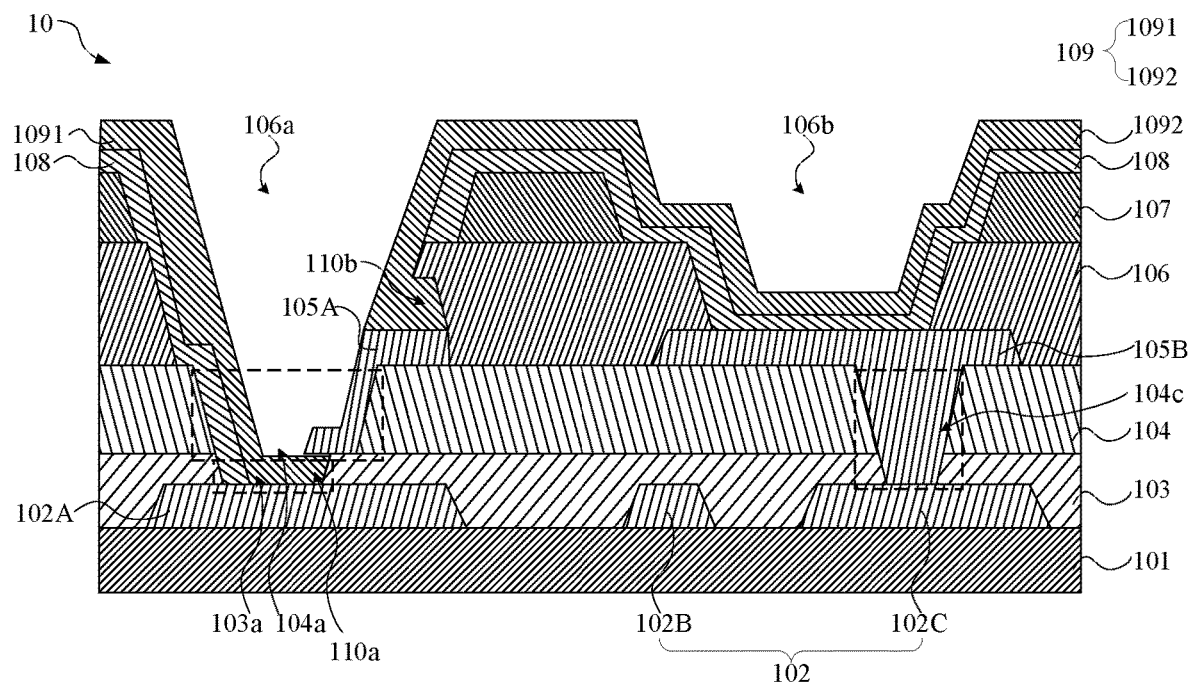
FIG. 1 is a first structural schematic view showing a display panel provided by the present disclosure.

Hereinafter preferred embodiments of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure. It should be noted that described embodiments are merely used to construct the present disclosure and are not intended to limit the present disclosure. In the present disclosure, unless further description is made, terms such as "top" and "bottom" usually refer to a top of a device and a bottom of a device in an actual process or working status, and specifically, to the orientation as shown in the drawings. Terms such as "inside" and "outside" are based on an outline of a device.

The present disclosure provides a display panel and a manufacturing method thereof which are respectively described in detail as follows. It should be noted that an order of embodiments described below does not limit a preferred order of the embodiments.

Please refer to FIG. 1, a first structural schematic view showing a display panel provided by the present disclosure is provided. A display panel 10 includes an array substrate 101, an auxiliary electrode layer 102A, a passivation layer 103, a planarization layer 104, a metal line layer 105A, a pixel-defining layer 106, and a first electrode layer 109. The auxiliary layer 102A is disposed on the array substrate 101. The passivation layer 103 is disposed on a side of the auxiliary electrode layer 102A away from the array substrate 101. A first through-hole 103a is defined on the passivation layer 103. The planarization layer 104 is disposed on a side of the passivation layer 103 away from the auxiliary electrode layer 102A. A first connecting hole 104a is defined on the planarization layer 104. The first connecting hole 104a is connected to the first through-hole 103a. The first metal line layer 105A is disposed on a side of the planarization layer 104 away from the passivation layer 103 and extends into the first connecting hole 104a. A first undercut structure 110a is formed at a contact area between the metal line layer 105A the passivation layer 103 near the first connecting hole 104a.

A pixel-defining layer 106 is disposed on a side of the planarization layer 104 away from the passivation layer 103. A first via 106a is defined on the pixel-defining layer 106. The first via 106a is connected to the first connecting hole 104a. A second undercut structure 110b is formed at a contact area between the pixel-defining layer 106 and the second metal layer 105A. The second undercut structure 110b is disposed on an extending surface of a lateral wall of the first connecting hole 104a. A first electrode layer 109 is disposed on a side of the pixel-defining layer 106 away from the planarization layer 104. The first electrode layer 109 includes a first sub-electrode layer 1091 and a second sub-electrode 1092. The first sub-electrode layer 1091 is embedded into the first undercut structure 110a by the first via 106a, first connecting hole 104a, and the first through-hole 103a, and is connected to the auxiliary electrode layer 102A. The second sub-electrode layer 1092 is embedded into the second undercut structure 110b by the first via 106a and the first connecting hole 104a, and is connected to the metal line layer 105A.

In the display panel 10 provided by the present disclosure, by forming the first undercut structure 110a and the second undercut structure 110b along a vertical direction of an overlappingly connecting hole of the first electrode layer 109 and the auxiliary electrode layer 102A, an overlappingly connecting area between the first electrode layer 109 and the auxiliary electrode layer 102A can be enlarged. As such, the first electrode layer 109 can be ensured to have high transparency and good conductivity, and an issue of IR drop of the first electrode layer 109 can be solved. Furthermore, by using this undercut structure as well as using the metal line layer 105A to overlappingly connect the first electrode layer 109 with the auxiliary electrode layer 102a, the overlappingly connecting area between the first electrode layer 109 and the auxiliary electrode layer 102a can be enlarged without reducing an aperture ratio of the display panel 10.

Figure 2:
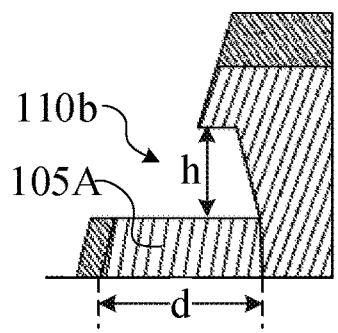
FIG. 2 is a schematic view showing a height and a depth of an undercut structure of the display panel provided by the present disclosure.

Wherein, as shown in FIG. 2, a schematic view showing a height and a depth of an undercut structure of the display panel is provided. A ratio between a height h of the first undercut structure 110a and a width d of the first undercut structure 110a is below 0.7. A ratio between a height h of the second undercut structure 110b and a width d of the second undercut structure 110b is below 0.7. Specifically, the ratio between the height h of the first undercut structure 110a and the width d of the first undercut structure 110a is 0.1, 0.2, 0.3, 0.4, 0.5, 0.6, 0.66, or 0.7. The ratio between the height h of the second undercut structure 110b and the width d of the second undercut structure 110b is 0.1, 0.2, 0.3, 0.4, 0.5, 0.6, 0.66, or 0.7. Wherein, the height-to-width ratio of the first undercut structure 110a and the height-to-width ratio of the second undercut structure 110b may be same or different. By making the height-to-width ratio of the first undercut structure 110a and the height-to-width ratio of the second undercut structure 110b below 0.7, a contact area between the first electrode 109 and the auxiliary electrode layer 102A or a contact area between the first electrode 109 and the metal line layer 105A can be enlarged with less evaporation of the first electrode layer 109. As such, material cost can be reduced. In addition, within this height-to-width ratio range, the first undercut structure 110a and the second undercut structure 110b can better satisfy manufacturing requirements. Moreover, undercut structures can be more stable within the height-to-width ratio below 0.7.

Wherein, an electrical resistance of the auxiliary electrode layer 102A is less than an electrical resistance of the first electrode layer 109. Specifically, the material of the auxiliary electrode layer 102 includes one of Al, Ni, Cr, Mo, Cu, W, or Ti. The material of the first electrode layer 109 includes Ag, Mg, or an Mg/Ag alloy.

Wherein, the electrical resistance of the auxiliary electrode layer 102A less than the electrical resistance of the first electrode layer 109 can be realized by adjusting electrical resistance of materials. Alternatively, it can also be realized by adjusting a length or an area of a cross-section of materials according to an electrical resistance formula. An electrical resistance R of conductors is proportional to their length L and electrical resistance p, and is inversely proportional to their cross-sectional area S. That is:

$$R = \rho L/S$$

Wherein, ρ is an electrical resistance of a material of a resistor, L is a length of a conductive line that helically winds to form the resistor, S is a cross-sectional area of the conductive line that helically winds to form the resistor, and R is an electrical resistance.

Wherein a material of the metal line layer 105A includes one or more of Ag, Al, Mo, Ti, indium gallium zinc oxide (IGZO), indium zinc tin oxide (IZTO), indium gallium zinc tin oxide (IGZTO), indium tin oxide (ITO), indium zinc oxide (IZO), indium aluminum zinc oxide (IAZO), indium gallium tin oxide (IGTO), and antimony tin oxide (ATO).

The above materials have good conductivity and high transparency. Furthermore, they have a relatively small thickness, and therefore would not affect an entire thickness of the display panel 10. In addition, they can reduce electronic radiation, ultraviolet light, and infrared light which are harmful to human body.

Wherein, a thickness of the metal line layer 105A ranges from 1500 Å to 8000 Å. Specifically, the thickness of the metal line layer 105A can be 1500 Å, 2000 Å, 2500 Å, 3000 Å, 3500 Å, 4000 Å, 5000 Å, 6000 Å, 7000 Å, 7500 Å, or 8000 Å. The metal line layer 105A is mainly configured to enlarge an overlappingly connecting area between the first electrode layer 109 and the auxiliary electrode layer 102A. Therefore, as long as conductivity of the metal line layer 105A can be ensured, a relatively small thickness and a relatively great forming area are preferable, thereby satisfying requirements of different display panels.

Wherein, the display panel 10 further includes a plurality of pixel-dividing layers 107 and a plurality of luminescent functional layers 108. The pixel-dividing layers 107 are disposed on a side of the pixel-defining layer 106 away from the array substrate 101. The luminescent functional layers 108 are disposed on a side of the pixel-dividing layer 107 away from the array substrate 101.

The pixel-defining layers 106 and the pixel-dividing layers 107 may form a double-bank structure or a line-bank structure, thereby preventing different luminescent functional layer 108 having different colors from leakage or mixing with each other.

Optionally, in some embodiments of the present disclosure, the pixel-defining layer 106 is lyophilic, and the pixel-dividing layer 107 is lipophilic.

A surface of lyophilic materials easily gets wet or melted due to liquid medium. On the contrary, a surface of lipophilic materials difficultly gets wet or melted due to liquid medium. Lyophilic properties and lipophilic properties of a surface of materials are determined according to functional groups of a structure of the surface. In the present disclosure, lyophilic properties and lipophilic properties of the pixel-defining layers 106 and lyophilic properties and lipophilic properties of the pixel-dividing layers 107 can be changed or adjusted by adjusting parameters of manufacturing processes such as a developing process and a curing process. By adjusting or changing lyophilic properties and lipophilic properties of the pixel-defining layers 106 and lyophilic properties and lipophilic properties of the pixel-dividing layers 107 cooperated with different printing processes, different ink, and different thicknesses of layers, the pixel-defining layer 106 and the pixel-dividing layer 107 can be easier to satisfy different requirements of different display panels.

Specifically, a thickness of a material of the pixel-defining layer 106 and a thickness of a material of the pixel-dividing layer 107 would affect lyophilic properties and lipophilic properties. For example, when lipophilic materials have an extremely thin thickness, the lipophilic materials do not have lipophilic properties. In addition, performing a plasma process on materials with $O_2$ or $N_2$ can change lipophilic properties to lyophilic properties. performing a plasma process on materials with F can change lyophilic properties to lipophilic properties.

Wherein, the luminescent functional layer 108 may include a hole injection layer, a hole transport layer, a luminescent layer, an electron transport layer, and an electron injection layer which are stacked along a direction away from the array substrate 101.

Figure 3:
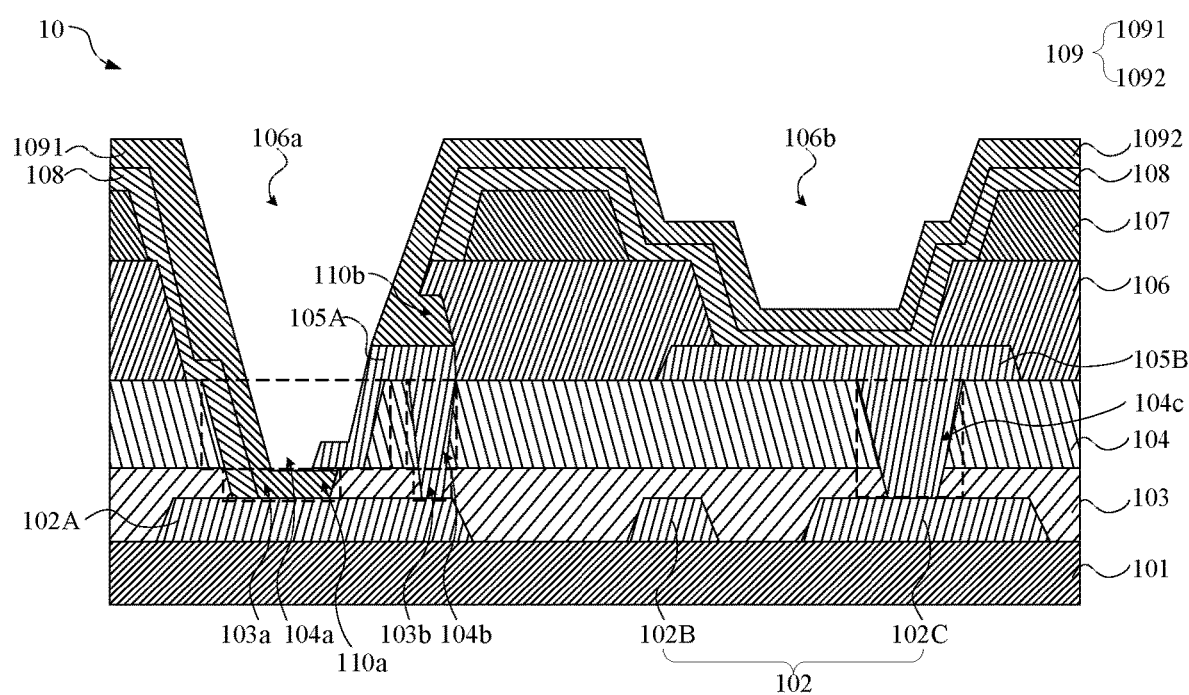
FIG. 3 is a second structural schematic view showing a display panel provided by the present disclosure.

Please refer to FIG. 3, a second structural schematic view showing a display panel provided by the present disclosure is provided. Differences between the display panel 10 as shown in FIG. 3 and the display panel 10 as shown in FIG. 1 are: in FIG. 3, a second through-hole 103b is further defined on the passivation layer 103, a second connecting hole 104b is further defined on the planarization layer 104, and the second connecting hole 104b is connected to the second through-hole 103b. The metal line layer 105A is connected to the auxiliary electrode layer 102A by the second connecting hole 104b and the second through-hole 103b. A contact area between the metal line layer 105A and the auxiliary electrode layer 102A can be further enlarged by this arrangement.

The display panel 10 as shown in FIG. 1 and the display panel 10 as shown in FIG. 3 further include a source/drain metal layer 102, a second electrode layer 105B, and a luminescent functional layer 108. A third connecting hole 104c is further defined on the passivation layer 103 and the planarization layer 104. The third connecting hole 104c extends from a side of the source/drain metal layer 102 away from the array substrate 101 to a side of the planarization layer 104 away from the array substrate 101. A second via 106b is further defined on the pixel-defining layer 106. Wherein, the source/drain metal layer 102 includes a drain metal layer 102B and a source metal layer 102C.

Wherein, the source/drain metal layer 102 and the auxiliary electrode layer 102A are disposed on a same layer. The second electrode layer 105B and the metal line layer 105A are disposed on a same layer. Furthermore, the second electrode layer 105B is connected to the source/drain metal layer 102 by the third connecting hole 104c. The luminescent functional layer 108 is disposed on a side of the pixel-defining layer 106 away from the array substrate 101. The luminescent functional layer 108 is connected to the auxiliary electrode layer 102A by the first through-hole 103a, the first connecting hole 104a, and the first via 106a. The luminescent functional layer 108 is connected to the second electrode layer 105B by the second via 106b. The first electrode layer 109 is disposed on a side of the luminescent functional layer 108 away from the pixel-defining layer 106.

Wherein, the array substrate 101 specifically includes a substrate, a light-shielding layer disposed on the substrate, a buffer layer covering the light-shielding layer and disposed on the substrate, and an active layer, a gate insulating layer, and a gate layer which are sequentially stacked on the buffer layer, and an interlayer dielectric layer disposed on a gate. The array substrate 10 may further include other structures. A structure and a forming way of the array substrate are conventional technologies and are not described here.

It should be noted that the present disclosure does not limit a structure of a thin-film transistor (TFT) formed in the display panel. The TFT may be a top-gate TFT, a bottom-gate TFT, a double-gate TFT, or a single-gate TFT. A specific structure of the TFT is not described here.

Wherein, a thickness of the metal line layer 105A and a thickness of the second electrode layer 105B may be equal or different. Because the metal line layer 105A and the second electrode layer 105B are disposed on a same layer, they can be formed in a same manufacturing process. Therefore, by making the thickness of the metal line layer 105A equal to the thickness of the second electrode layer 105B, manufacturing processes can be simplified, and a manufacturing period can be reduced.

Wherein, the first electrode layer 109 is a cathode, the second electrode layer 105B is an anode, and the auxiliary electrode layer 102A is an auxiliary cathode.

In the display panel 10 provided by the present embodiment, the auxiliary electrode layer 102A and the source/drain metal layer 102 are disposed on a same layer, and the metal line layer 105A and the second electrode layer 105B are disposed on a same layer. This arrangement allows the auxiliary electrode layer 102A and the source/drain metal layer 102 to be formed in a same process. Similarly, the metal line layer 105A and the second electrode layer 105B may be formed in a same process. Therefore, it is unnecessary to add other steps or other manufacturing devices.

Figure 4:
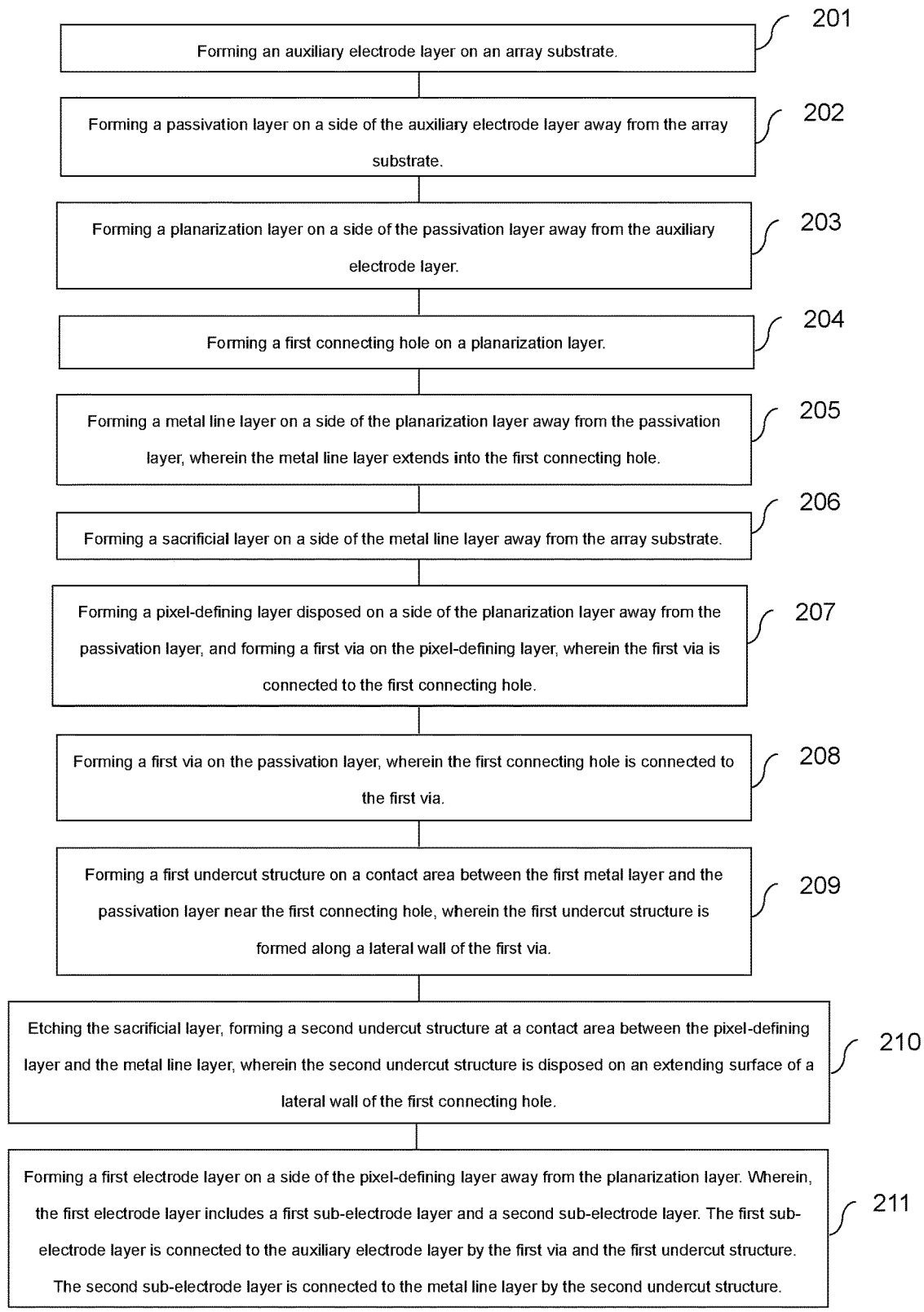
FIG. 4 is a first schematic flowchart showing steps of a method of manufacturing a display panel provided by the present disclosure.
Figure 5A:
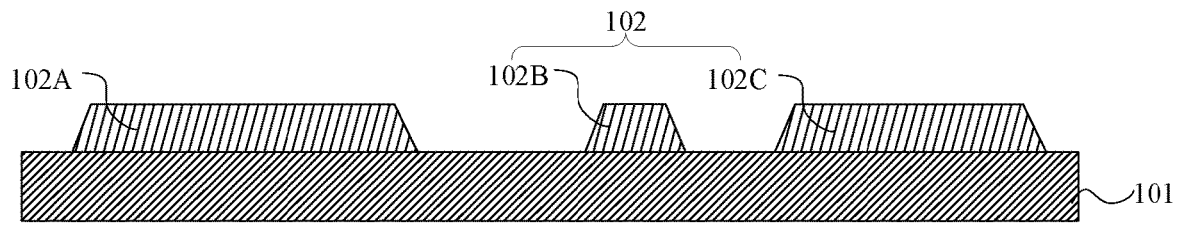
FIGS. 5a to 5g are schematic views showing the steps of the method of manufacturing the display panel provided by the present disclosure.
Figure 5B:
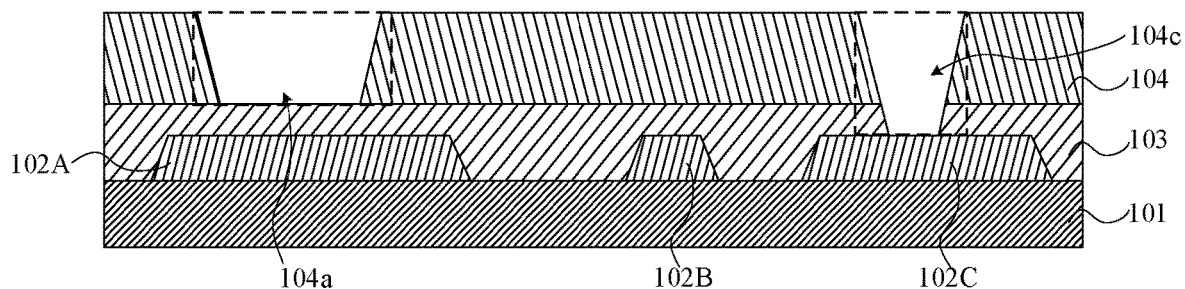
Figure 5C:
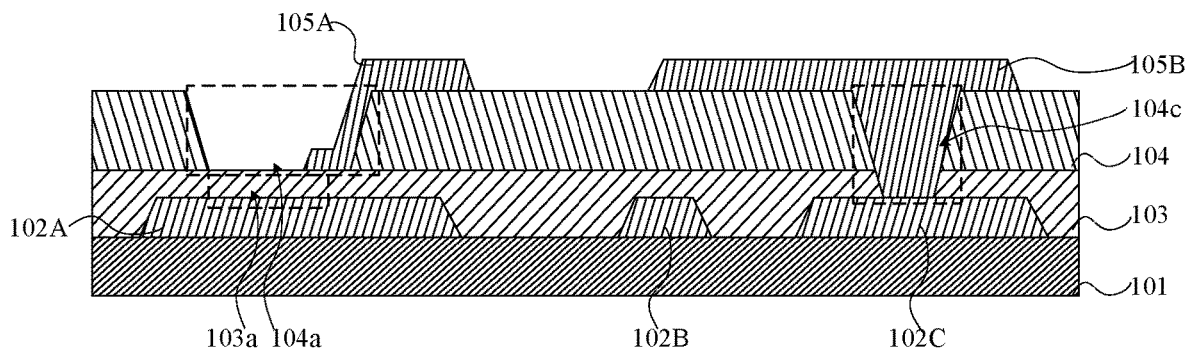
Figure 5D:
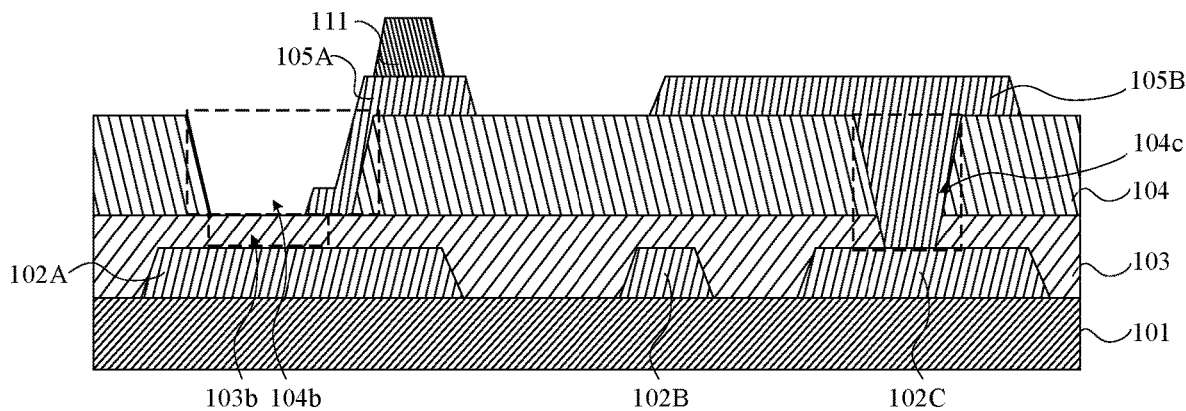
Figure 5E:
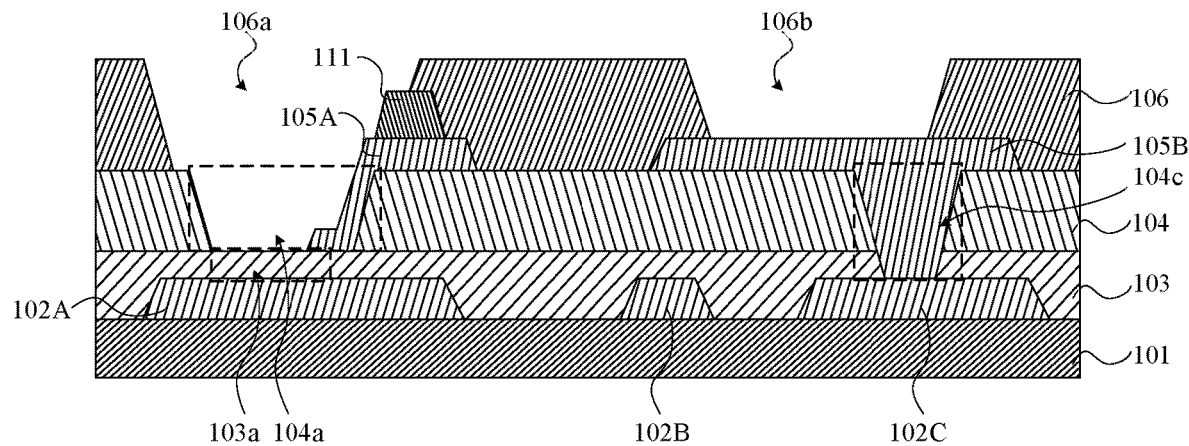
Figure 5F:
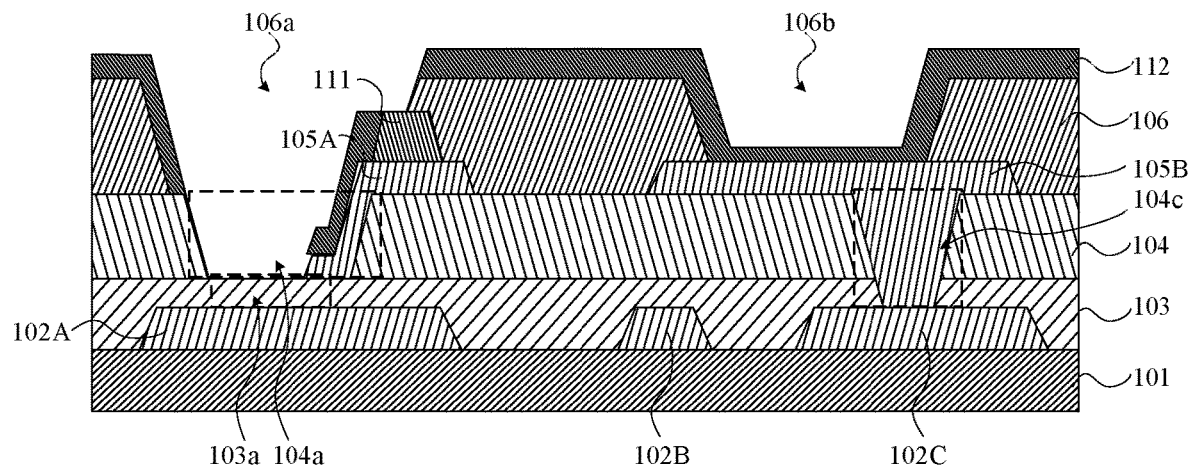
Figure 5G:
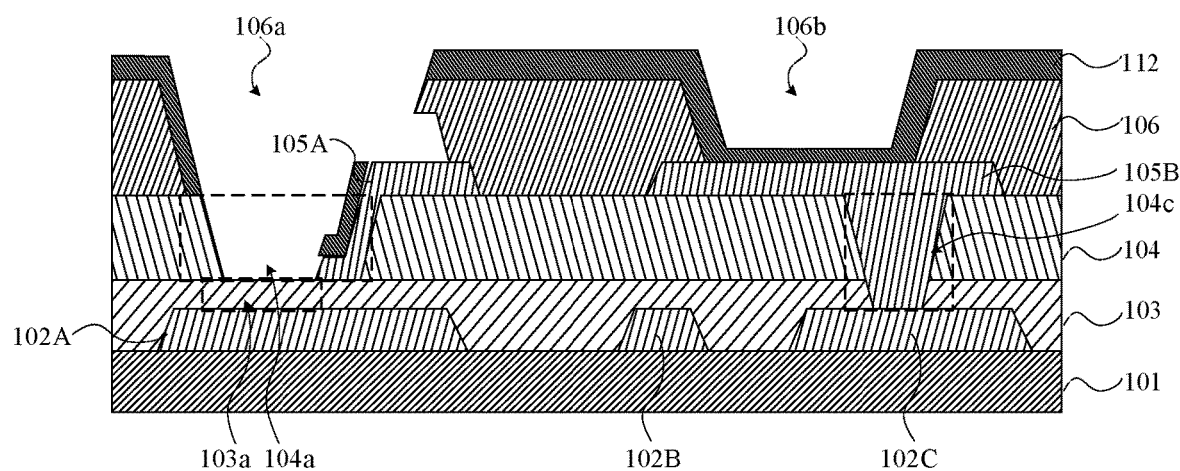

Please refer to FIG. 4 to FIG. 5g. FIG. 4 is a first schematic flowchart showing steps of a method of manufacturing a display panel provided by the present disclosure. FIGS. 5a to 5g are schematic views showing the method of manufacturing the display panel provided by the present disclosure. The present disclosure provides a method of manufacturing a display panel, specifically including following steps:

201, forming an auxiliary electrode layer 102A on an array substrate 101.

Wherein, the auxiliary electrode layer 102A is disposed on the array substrate 101 by deposition such as physical vapor deposition (PVD), chemical vapor deposition (CVD), and plasma chemical vapor deposition (PCVD).

Wherein, when the auxiliary electrode layer 102A is disposed on the array substrate 101, the source/drain metal layer 102 is disposed on a same layer.

Specifically, as shown in FIG. 5a, a schematic view showing steps of forming the auxiliary electrode layer and the source/drain metal layer 102 is provided. A metal material is disposed on the array substrate 101 by deposition. Then, the metal material is patterned by lithography and etching to form the auxiliary electrode layer 102A and the source/drain metal layer 102. Wherein, the source/drain metal layer 102 is a drain metal layer 102B and a source metal layer 102C.

202, forming a passivation layer 103 on a side of the auxiliary electrode layer 102A away from the array substrate 101.

203, forming a planarization layer 104 on a side of the passivation layer 103 away from the auxiliary electrode layer 102A.

204, forming a first connecting hole 104a on a planarization layer 104.

Specifically, as shown in FIG. 5b, a schematic view showing steps of forming a hole on the planarization layer and the passivation layer is provided. Wherein, the first connecting hole 104a is formed on the planarization layer 104 by lithography or etching.

Wherein, the step further includes forming a third connecting hole 104c on the passivation layer 103 and the planarization layer 104 by etching.

205, forming a metal line layer 105A on a side of the planarization layer 104 away from the passivation layer 103, wherein the metal line layer 105A extends into the first connecting hole 104a.

Please refer to FIG. 5c, a schematic showing steps of forming the metal line layer is provided. Specifically, the metal line layer 105A is disposed on the side of the planarization layer 104 away from the passivation layer 103 by deposition. When the metal line layer 105A is disposed on the side of the planarization layer 104 away from the passivation layer 103, a second electrode layer 105B is disposed on a same layer.

Wherein, the metal line layer 105A is connected to the auxiliary electrode layer 102 by the first connecting hole 104a and the first through-hole 103a. Furthermore, the metal line layer 105A extends to a side of the passivation layer 103 away from the array substrate 101 by the first connecting hole 104a. Then, the metal line layer 105A and the second electrode layer 105B are patterned by lithography or etching. Wherein, a part of the metal line layer 105A extending to a surface of the passivation layer 103 away from the array substrate 101 by the connecting hole 104a is provided with a protrusion part. The protrusion part extends to a surface of the passivation layer 103 away from the array substrate 101, thereby ensuring an overlapping connection between the first electrode layer and the auxiliary electrode layer 102A and ensuring a continuous layer. The first electrode overlappingly connected to the auxiliary electrode layer 102A cannot be the continuous layer without the protrusion part.

206, forming a sacrificial layer 111 on a side of the metal line layer 105A away from the array substrate 101.

Specifically, please refer to FIG. 5, a schematic view showing a step of forming the sacrificial layer is provided. The sacrificial layer 111 is disposed on the side of the metal line layer 105A away from the array substrate 101. The sacrificial layer 111 is patterned by lithography or etching, and the sacrificial layer 111 disposed on the metal line layer 105A is retained.

207, forming a pixel-defining layer 106 disposed on a side of the planarization layer 104 away from the passivation layer 103, and forming a first via 106a on the pixel-defining layer 106, wherein the first via 106a is connected to the first connecting hole 104a.

Wherein, as shown in FIG. 5e, a schematic view showing a step of forming the pixel-defining layer and the first via is provided. Specifically, the pixel-defining layer 106 is formed on a side of the sacrificial layer 111 away from the array substrate 101, a side of the metal line layer 105A away from the array substrate 101, a side of the second electrode layer 105B away from the array substrate 101, and a side of the planarization layer 104 away from the array substrate 101. Then, a drilling process is performed on the pixel-defining layer 106 by lithography or etching, thereby forming the first via 106a and a second via 106b.

208, forming a first through-hole 103a on the passivation layer 103, wherein the first connecting hole 104a is connected to the first through-hole 103a.

209, forming a first undercut structure 110a at a contact area between the first metal layer 105A and the passivation layer 103 near the first connecting hole 104a, wherein the first undercut structure 110a is formed along a lateral wall of the first via 103a.

Wherein, the step of forming the first undercut structure 110a at the contact area between the metal line layer 105A near the first connecting hole 104a includes following steps:

2101, forming a photoresist layer 112 on a side of the planarization layer 104 away from the array substrate 101, a side of the pixel-defining layer 106 away from the array substrate 101, a side of the metal line layer 105A away from the array substrate 101, and a side of the second electrode layer 105 away from the array substrate 101, wherein the photoresist layer 112 exposes the first connecting hole 104a.

Please refer to FIG. 5f, a schematic view showing a step of forming the photoresist layer is provided. Specifically, forming the photoresist layer 112 on a side of the planarization layer 104 away from the array substrate 101, a side of the pixel-defining layer 106 away from the array substrate 101, a side of the metal line layer 105A away from the array substrate 101, and a side of the second electrode layer 105B away from the array substrate 101, wherein the photoresist layer 112 exposes the first connecting hole 104a.

2102, performing a first etching process on the passivation layer 103 below the first connecting hole 104a, thereby forming the first undercut structure 110a at a contact area of the metal line layer 105A near the first connecting hole 104a.

Specifically, as shown in FIG. 5g, a schematic showing a step of forming the undercut structure is provided. Specifically, the first etching process is performed on the passivation layer 103 below the first connecting hole 104a, thereby forming the first via 103a at the contact area of the metal line layer 105A near the first connecting hole 104a. The undercut structure 110a is formed at the contact area between the first via 103a and the metal line layer 105A.

Specifically, the first etching process may be a wet-etching process or a dry-etching process. Specifically, a chemical etching process, an electrolytic etching process, an ion beam sputtering etching process, a plasma etching process, or a reactive particle etching process can be used. Furthermore, the first etching process may be the chemical etching process, and an etchant used in the first etching process may be hydrofluoric acid.

2103, removing the photoresist layer 112.

210, etching the sacrificial layer 111, forming a second undercut structure 110b at a contact area between the pixel-defining layer 106 and the metal line layer 105A, wherein the second undercut structure 110b is disposed on an extending surface of a lateral wall of the first connecting hole 104a.

Wherein, the step of forming the second undercut structure 110b at the contact area between the pixel-defining layer 106 and the metal line layer 105A includes following steps:

2111, forming the photoresist layer 112 on a side of the planarization layer 104 away from the array substrate 101, a side of the pixel-defining layer 106 away from the array substrate 101, a side of the metal line layer 105A away from the array substrate 101, and a side of the second electrode layer 105B away from the array substrate 101, wherein the photoresist layer 112 exposes the sacrificial layer 111.

2112, performing a second etching process on the sacrificial layer 111, thereby forming the second undercut structure 110b at the contact area between the pixel-defining layer 106 and the metal line layer 105A.

Please refer to FIG. 5f and FIG. 5g again, the photoresist layer 112 is formed on the side of the planarization layer 104 away from the array substrate 101, the side of the pixel-defining layer 106 away from the array substrate 101, the side of the metal line layer 105A away from the array substrate 101, and the side of the second electrode layer 1058 away from the array substrate 101. The photoresist layer 112 exposes the sacrificial layer 111. Then, the second etching process is performed on the sacrificial layer 111, thereby forming the second undercut structure 110b at the contact area between the pixel-defining layer 106 and the metal line layer 105A.

Specifically, the second etching process may be a wet-etching process or a dry-etching process. Specifically, a chemical etching process, an electrolytic etching process, an ion beam sputtering etching process, a plasma etching process, or a reactive particle etching process can be used. Furthermore, the first etching process may be the chemical etching process, and an etchant used in the first etching process may be oxalic acid, copper acid, aluminum acid, or a combination thereof.

2113, removing the photoresist layer 112.

Wherein, the first undercut structure 110a and the second undercut structure 110b may be formed in a same process, or may be formed in two processes. After the first undercut structure 110a and the second undercut structure 110b are formed, the photoresist layer is stripped off.

In some embodiments, after the first undercut structure 110a and the second undercut structure 110b are formed, a pixel-dividing layer 107 is formed on the pixel-defining layer 106. Specifically, as shown in FIG. 3, the pixel-dividing layer 107 is disposed on the side of the pixel-defining layer 106 away from the array substrate 101, and a luminescent functional layer 108 is disposed on a side of the pixel-dividing layer 107 away from the array substrate 101.

Specifically, a hole injection layer, a hole transport layer, a luminescent layer, an electron transport layer, and an electron injection layer are sequentially disposed on a first surface by inkjet printing. Specifically, a material is inkjet-printed on each layer. Then, the material on each layer is planarized and dried. After that, the material on each layer is baked to form the luminescent functional layer. The inkjet printing can precisely control an area where layers are formed, thereby saving a material, reducing cost, and improving a yield rate.

It should be noted that FIG. 3 only exemplary shows the electron transport layer of the luminescent functional layer 108. However, FIG. 3 does not limit an arrangement of other layers of the luminescent functional layer 108. The arrangement of other layers of the luminescent functional layer 108 is known by those skilled in the art and is not described here.

211, forming a first electrode layer 109 on a side of the pixel-defining layer 106 away from the planarization layer 104. Wherein, the first electrode layer 109 includes a first sub-electrode layer 1091 and a second sub-electrode layer 1092. The first sub-electrode layer 1091 is connected to the auxiliary electrode layer 102A by the first via 103a and the first undercut structure 110a. The second sub-electrode layer 1092 is connected to the metal line layer 105A by the second undercut structure 110b.

After the first electrode layer 109 is disposed, the display panel 10 as shown in FIG. 3 is obtained.

Wherein, the first electrode layer 109 is disposed by sputtering or evaporation.

Specifically, in the evaporation process, a material of the first electrode layer is evaporated or sublimated to form gas particles. Then, the gas particles are transported to a side of the pixel-defining layer away from the planarization layer and are attached to the side of the pixel-defining layer away from the planarization layer to form a core that grows up to form a thin solid film. After that, atoms of the thin solid film are reconstructed or are connected to each other by a chemical bonding to form the first electrode layer. Layers can be easily formed by the evaporation process, and purity and dense of a thin film of layers are high. Moreover, an evaporation angle is adjusted by linear-source evaporation or dot-source evaporation, thereby making the material of the first electrode layer enter the first undercut structure and the second undercut structure.

Figure 6:
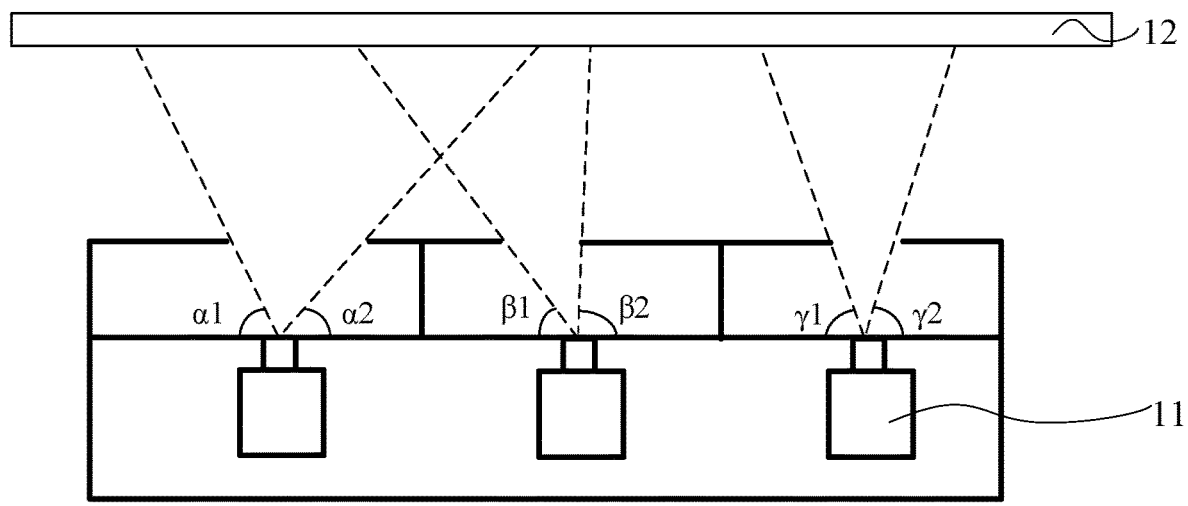
FIG. 6 is a schematic view showing an evaporation angle during an evaporation process of the display panel provided by the present disclosure.

Wherein, the evaporation angle of evaporation ranges from 40° to 85°. Specifically, the evaporation angle may be 40°, 45°, 50°, 60°, 65°, 70°, 75°, or 85°. Wherein, please refer to FIG. 6, a schematic view showing an evaporation angle during an evaporation process of the display panel is provided. FIG. 6 shows dot-source evaporation as an example. When an evaporation target 12 is evaporated by an evaporation source 11, an evaporation angle of the evaporation source 11 can be adjusted. For example, evaporation angels $\alpha 1$, $\alpha 2$, $\beta 1$, $\beta 2$, $\gamma 1$, and $\gamma 2$ are shown in FIG. 6.

Specifically, in the sputtering process, the first electrode layer target is bombarded by charged particles under inert gas, collision of atoms occurs on a surface and results in transfer of energy and momentum. Therefore, atoms of the first electrode layer exit from the surface and are deposited on a side of the pixel-defining layer away from the planarization layer. By performing the sputtering process to form a layer, the layer can have good malleability, thereby forming an overlapping connection in the first undercut structure and the second undercut structure.

In the method of manufacturing the display panel provided by the present disclosure, by forming the first undercut structure and the second undercut structure along a vertical direction of an overlappingly connecting hole of the first electrode layer and the auxiliary electrode layer, an overlappingly connecting area between the first electrode layer and the auxiliary electrode layer can be enlarged, thereby ensuring that the first undercut structure has high transparency and good conductivity. In addition, an issue of IR drop of the first electrode can be solved. Furthermore, by using this undercut structure as well as using the metal line layer to realize an overlapping connection between the first electrode layer and the auxiliary electrode layer, the overlappingly connecting area between the first electrode layer and the auxiliary electrode layer can be enlarged without reducing an aperture ratio of the display panel. In addition, in the method of manufacturing the display panel provided by the present disclosure, no additional manufacturing devices need to be added. Therefore, the method is simple and operatable, which is beneficial for mass production.

Figure 7:
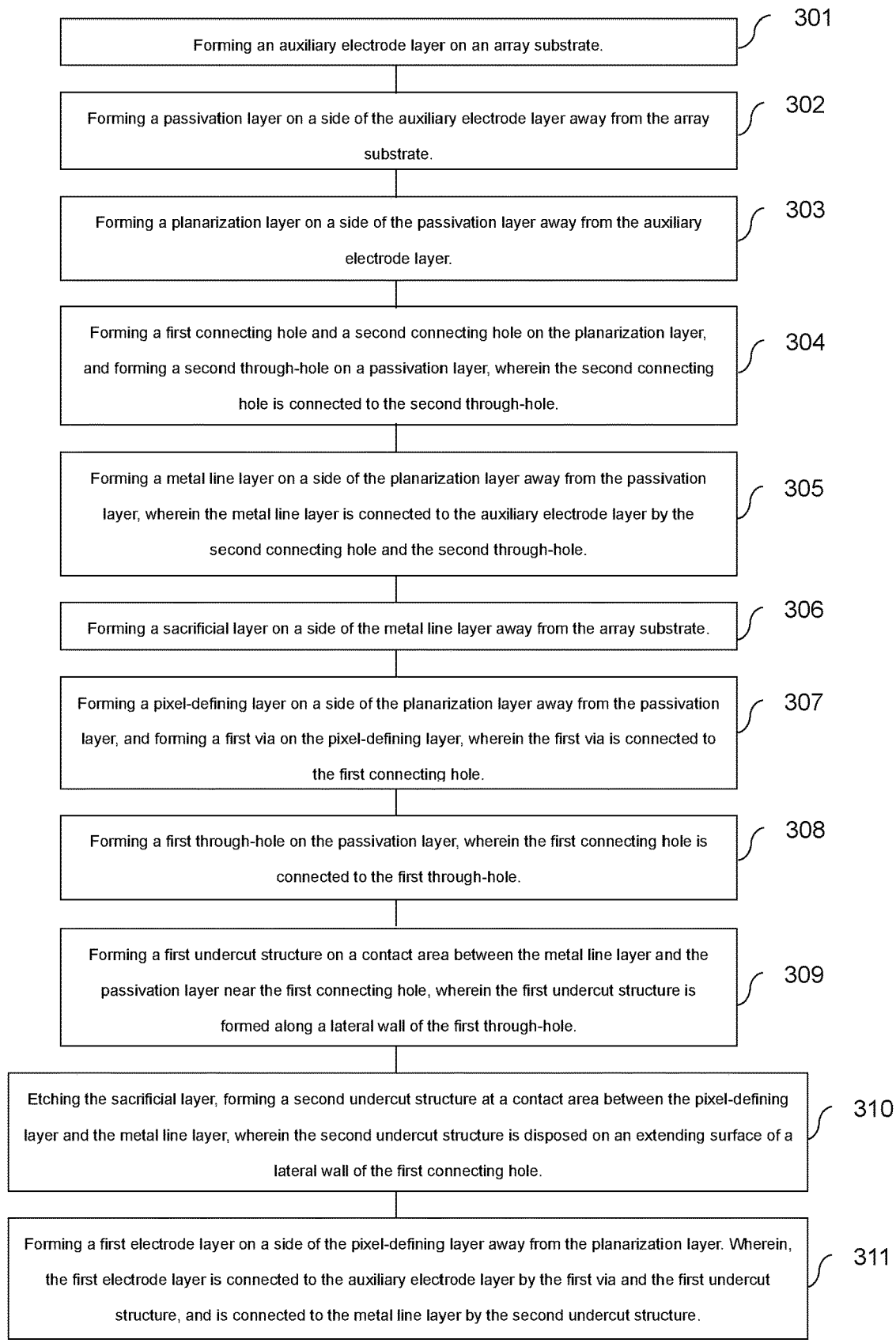
FIG. 7 is a second schematic flowchart showing steps of a method of manufacturing a display panel provided by the present disclosure.

Please refer to FIG. 7, a second schematic flowchart showing a method of manufacturing the display panel provided by the present disclosure is provided. The present disclosure further provides a method of manufacturing a display panel, specifically including following steps:

301, forming an auxiliary electrode layer on an array substrate.

302, forming a passivation layer on a side of the auxiliary electrode layer away from the array substrate.

303, forming a planarization layer on a side of the passivation layer away from the auxiliary electrode layer.

304, forming a first connecting hole and a second connecting hole on the planarization layer, and forming a second through-hole on a passivation layer, wherein the second connecting hole is connected to the second through-hole.

305, forming a metal line layer on a side of the planarization layer away from the passivation layer, wherein the metal line layer is connected to the auxiliary electrode layer by the second connecting hole and the second through-hole.

306, forming a sacrificial layer on a side of the metal line layer away from the array substrate.

307, forming a pixel-defining layer on a side of the planarization layer away from the passivation layer, and forming a first via on the pixel-defining layer, wherein the first via is connected to the first connecting hole.

308, forming a first through-hole on the passivation layer, wherein the first connecting hole is connected to the first through-hole.

309, forming a first undercut structure at a contact area between the metal line layer and the passivation layer near the first connecting hole, wherein the first undercut structure is formed along a lateral wall of the first through-hole.

Wherein, in the step of forming the first undercut structure at the contact area of the metal line layer near the first connecting hole, the method specifically includes following steps:

3091, forming a photoresist layer on a side of the planarization layer away from the array substrate, a side of the pixel-defining layer away from the array substrate, a side of the metal line layer away from the substrate, and a side of the second electrode layer away from the array substrate, wherein the photoresist layer exposes the first connecting hole.

3092, performing a first etching process on the passivation layer below the first connecting hole, thereby forming a first undercut structure at a contact area of the metal line layer near the first connecting hole.

3093, removing the photoresist layer.

310, etching the sacrificial layer, and forming a second undercut structure at a contact area between the pixel-defining layer and the metal line layer, wherein the second undercut structure is formed on an extending surface of a lateral wall of the first connecting hole.

Wherein, in the step of forming the second undercut structure at the contact area between the pixel-defining layer and the metal line layer, the method specifically includes following steps:

3101, forming the photoresist layer on the side of the planarization layer away from the array substrate, the side of the pixel-defining layer away from the array substrate, the side of the metal line layer away from the substrate, and the side of the second electrode layer away from the array substrate, wherein the photoresist layer exposes the first connecting hole.

3102, performing a second etching process on the sacrificial layer, thereby forming the second undercut structure at the contact area between the pixel-defining layer and the metal line layer.

3103, removing the photoresist layer.

Wherein, the first undercut structure and the second undercut structure can be formed in a same process, or can be formed in two processes. After the first undercut structure and the second undercut structure are formed, the photoresist layer is stripped off.

In some embodiments, after the first undercut structure and the second undercut structure are formed, the method further includes a following step: forming a pixel-dividing layer on the pixel-defining layer. Specifically, as shown in FIG. 3, forming a pixel-dividing layer 107 on a side of the pixel-defining layer 106 away from the array substrate 101, and forming a luminescent functional layer 108 on a side of the pixel-dividing layer 107 away from the array substrate 101.

Specifically, a hole injection layer, a hole transport layer, a luminescent layer, an electron transport layer, and an electron injection layer are sequentially formed on a first surface by inkjet printing. Specifically, a material is inkjet printed on each layer. Then, the material on each layer is planarized and dried. After that, the material on each layer is baked to form the luminescent functional layer. The inkjet printing can realize precisely control an area where layers form, thereby saving a material, reducing cost, and improving a yield rate.

It should be noted that FIG. 3 only exemplary shows an electron transport layer of a luminescent functional layer 108. However, FIG. 3 does not limit an arrangement of other layers of the luminescent functional layer 108. The arrangement of other layers of the luminescent functional layer 108 is known by those skilled in the art and is not described here.

311, forming a first electrode layer on a side of the pixel-defining layer away from the planarization layer. Wherein, the first electrode layer is connected to the auxiliary electrode layer by the first via and the first undercut structure, and is connected to the metal line layer by the second undercut structure.

After the first electrode layer is disposed, the display panel as shown in FIG. 3 is obtained.

Wherein, the first electrode layer 109 is disposed by sputtering or evaporation.

Specifically, in the evaporation process, a material of the first electrode layer is evaporated or sublimated to form gas particles. Then, the gas particles are transported to a side of the pixel-defining layer away from the planarization layer and are attached to the side of the pixel-defining layer away from the planarization layer to form a core that grows up to form a thin solid film. After that, atoms of the thin solid film are reconstructed or are connected to each other by a chemical bonding to form the first electrode layer. Layers can be easily formed by the evaporation process, and purity and dense of a thin film of layers are high. Moreover, an evaporation angle is adjusted by linear-source evaporation or dot-source evaporation, thereby making the material of the first electrode layer enter the first undercut structure and the second undercut structure.

Wherein, the evaporation angle of evaporation ranges from 40° to 85°. Specifically, the evaporation angle may be 40°, 45°, 50°, 60°, 65°, 70°, 75°, or 85°. Wherein, please refer to FIG. 6, a schematic view showing an evaporation angle during an evaporation process of the display panel is provided. FIG. 6 shows dot-source evaporation as an example. When an evaporation target 12 is evaporated by an evaporation source 11, an evaporation angle of the evaporation source 11 can be adjusted. For example, evaporation angels $\alpha 1$, $\alpha 2$, $\beta 1$, $\beta 2$, $\gamma 1$, and $\gamma 2$ are shown in FIG. 6.

Specifically, in the sputtering process, the first electrode layer target is bombarded by charged particles under inert gas, collision of atoms occurs on a surface and results in transfer of energy and momentum. Therefore, atoms of the first electrode layer exit from the surface and are deposited on a side of the pixel-defining layer away from the planarization layer. By performing the sputtering process to form a layer, the layer can have good malleability, thereby forming an overlapping connection in the first undercut structure and the second undercut structure.

In the method of manufacturing the display panel provided by the present disclosure, by forming a first undercut structure and a second undercut structure along a vertical direction of an overlappingly connecting hole of a first electrode layer and an auxiliary electrode layer, an overlappingly connecting area between the first electrode layer and the auxiliary electrode layer can be enlarged, thereby ensuring that the first undercut structure has high transparency and good conductivity. In addition, an issue of IR drop of the first electrode can be solved. Furthermore, by using this undercut structure as well as using a metal line layer to realize an overlapping connection between the first electrode layer and the auxiliary electrode layer, the overlappingly connecting area between the first electrode layer and the auxiliary electrode layer can be enlarged without reducing an aperture ratio of the display panel. In addition, in the method of manufacturing the display panel provided by the present disclosure, no additional manufacturing devices need to be added. Therefore, the method is simple and operatable, which is beneficial for mass production.

Figure 8:
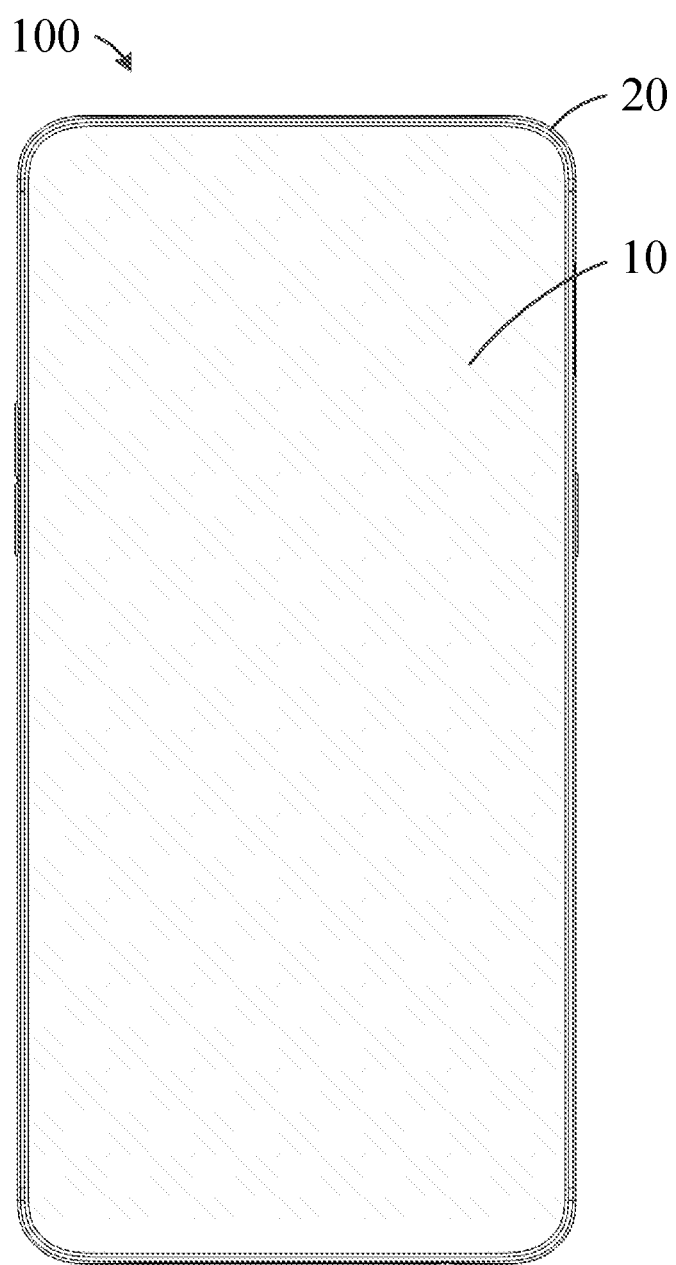
FIG. 8 is a structural schematic view showing a display device provided by the present disclosure.

The present disclosure provides a display device. As shown in FIG. 8, a structural schematic view showing the display device provided by the present disclosure is provided. A display device 100 includes a display panel 10 and an encapsulation structure 20. The display panel 10 is the above-mentioned display panel.

The display device 100 may further include other components. The encapsulation structure 20, other components, and forming ways thereof are known by those skilled in the art and are not described here.

The display device 100 provided by the present disclosure includes the display panel 10. In the display panel 10, a first undercut structure and a second undercut structure are formed along a vertical direction of an overlappingly connecting hole of a first electrode layer and an auxiliary electrode layer. Therefore, an overlappingly connecting area between the first electrode layer and the auxiliary electrode layer can be enlarged. As such, the first electrode layer can be ensured to have high transparency and good conductivity, thereby solving an issue of IP drop of the first electrode. In addition, by using this undercut structure as well as using a metal line layer to overlappingly connect the first electrode layer with the auxiliary electrode layer, the overlappingly connecting area between the first electrode layer and the auxiliary electrode layer can be enlarged without reducing an aperture ratio of the display panel.

The display device 100 provided by the present disclosure may be used in an electronic device such as a smartphone, a tablet personal computer, a mobile phone, video phone, an electric book reader, a desktop computer, a laptop computer, a netbook computer, a workstation, a server, a personal digital assistant, a portable multimedia player, an MP3 player, a mobile medicine, medical equipment, a camera, a game console, a digital camera, a car navigation system, an electronic billboard, an automatic teller machine, or a wearable device.

A display panel, a manufacturing method thereof, and a display device have been described in detail by the above embodiments, which illustrate principles and implementations thereof. However, the description of the above embodiments is only for helping to understand the technical solution of the present disclosure and core ideas thereof, and it is understood by those skilled in the art that many changes and modifications to the described embodiments can be carried out without departing from the scope and the spirit of the disclosure that is intended to be limited only by the appended claims.

What is claimed is:

1. A display panel, comprising:
an array substrate;
an auxiliary electrode layer disposed on the array substrate;
a passivation layer disposed on a side of the auxiliary electrode layer away from the array substrate, wherein a first through-hole is defined on the passivation layer;
a planarization layer disposed on a side of the passivation layer away from the auxiliary layer, wherein a first connecting hole is defined on the planarization layer and is connected to the first through-hole;
a metal line layer disposed on a side of the planarization layer away from the passivation layer and extending into the first connecting hole, wherein a first undercut structure is formed at a contact area between the metal line layer and the passivation layer near the first connecting hole;
a pixel-defining layer disposed on a side of the planarization layer away from the passivation layer, wherein a first via is defined on the pixel-defining layer, the first via is connected to the first connecting hole, a second undercut structure is formed at a contact area between the pixel-defining layer and the metal line layer, and the second undercut structure is formed on an extending surface of a lateral wall of the first connecting hole; and
a first electrode layer disposed on a side of the pixel-defining layer away from the planarization layer, wherein the first electrode layer comprises a first sub-electrode layer and a second sub-electrode layer, the first electrode layer is embedded into the first undercut structure by the first via, the first connecting hole, and the first through-hole and is connected to the auxiliary electrode layer, and the second sub-electrode layer is embedded into the second undercut structure by the first via and the first connecting hole and is connected to the metal line layer, and the metal line layer is connected to the first sub-electrode layer and the second sub-electrode layer.

2. The display panel of claim 1, wherein a ratio of a height of the first undercut structure to a width of the first undercut structure is below 0.7, and a ratio of a height of the second undercut structure to a width of the second undercut structure is below 0.7.

3. The display panel of claim 1, wherein a second through-hole is further defined on the passivation layer, a second connecting hole is further defined on the planarization layer, the second connecting hole is connected to the second through-hole, and the metal line layer is connected to the auxiliary electrode layer by the second connecting hole and the second through-hole.

4. The display panel of claim 1, wherein an electrical resistance of the metal line layer is less than an electrical resistance of the first electrode layer.

5. The display panel of claim 1, wherein a thickness of the metal line layer ranges from 1500 Å to 8000 Å.

6. The display panel of claim 1, wherein the display panel comprises a source/drain metal layer, a second electrode layer, and a luminescent functional layer, a third connecting hole is further defined on the passivation layer and the planarization layer, the third connecting hole extends from a side of the source/drain metal layer away from the array substrate to a side of the planarization layer away from the array substrate, a second via is further defined on the pixel-defining layer; and
the source/drain metal layer and the auxiliary electrode layer are disposed on a same layer, the second electrode layer and the metal line layer are disposed on a same layer, the second electrode layer is connected to the source/drain metal layer by the third connecting hole, the luminescent functional layer is disposed on a side of the pixel-defining layer away from the array substrate, the luminescent functional layer is connected to the auxiliary electrode layer by the first through-hole, the first connecting hole, and the first via, the luminescent functional layer is connected to the second electrode layer by the second via, and the first electrode layer is disposed on a side of the luminescent functional layer away from the pixel-defining layer.

7. A method of manufacturing a display panel, comprising following steps:
   forming an auxiliary electrode layer on an array substrate;
   forming a passivation layer on a side of the auxiliary electrode layer away from the array substrate;
   forming a planarization layer on a side of the passivation layer away from the auxiliary electrode layer;
   forming a first connecting hole on the planarization layer;
   forming a metal line layer on a side of the planarization layer away from the passivation layer, wherein the metal line layer extends into the first connecting hole;
   forming a sacrificial layer on a side of the metal line layer away from the array substrate;
   forming a pixel-defining layer on a side of the planarization layer away from the passivation layer, and forming a first via on the pixel-defining layer, wherein the first via is connected to the first connecting hole;
   forming a first through-hole on the passivation layer, wherein the first connecting hole is connected to the first through-hole;
   forming a first undercut structure at a contact area between the metal line layer and the passivation layer near the first connecting hole, wherein the first undercut structure is formed along a lateral wall of the first through-hole;
   etching the sacrificial layer, and forming a second undercut structure at a contact area between the pixel-defining layer and the metal line layer, wherein the second undercut structure is formed on an extending surface of a lateral wall of the first connecting hole; and
   forming a first electrode layer on a side of the pixel-defining layer away from the planarization layer, wherein the first electrode layer comprises a first sub-electrode layer and a second sub-electrode layer, the first sub-electrode layer is connected to the auxiliary electrode layer by the first through-hole and the first undercut structure, and the second sub-electrode layer is connected to the metal line layer by the second undercut structure, and the metal line layer is connected to the first sub-electrode layer and the second sub-electrode layer.

8. The method of claim 7, wherein in the step of forming the first connecting hole on the planarization layer, the method further comprises following steps: forming a second connecting hole on the planarization layer, and forming a second through-hole on the passivation layer, wherein the second connecting hole is connected to the second through-hole; and
   wherein the metal line layer is connected to the auxiliary electrode layer by the second connecting hole and the second through-hole.

9. The method of claim 7, comprising following steps:
   when the auxiliary electrode layer is formed on the array substrate, forming a source/drain metal layer on a same layer; and
   when the metal line layer is formed on the side of the planarization layer away from the passivation layer, forming a second electrode layer on a same layer.

10. The method of claim 9, wherein in the step of forming the first undercut structure at the contact area between the metal line layer and the passivation layer near the first connecting hole, the method comprises following steps:
    forming a photoresist layer on a side of the planarization layer away from the array substrate, a side of the pixel-defining layer away from the array substrate, a side of the metal line layer away from the array substrate, and a side of the second electrode layer away from the substrate, wherein the photoresist layer exposes the first connecting hole;
    performing a first etching step on the passivation layer below the first connecting hole, thereby forming the first undercut structure at the contact area of the metal line layer near the first connecting hole; and
    removing the photoresist layer.

11. The method of claim 7, wherein the step of forming the second undercut structure at the contact area between the pixel-defining layer and the metal line layer comprises:
    forming a photoresist layer on a side of the planarization layer away from the array substrate, a side of the pixel-defining layer away from the array substrate, a side of the metal line layer away from the array substrate, and a side of the second electrode layer away from the substrate, wherein the photoresist layer exposes the sacrificial layer;
    performing a second etching step on the sacrificial layer, thereby forming the second undercut structure at the contact area between the pixel-defining layer and the metal line layer; and
    removing the photoresist layer.

12. The method of claim 11, wherein an etchant used in the first etching step is hydrogen fluoride, and an etchant used in the second etching step is one or more of oxalic acid, copper acid, and aluminum acid.

13. The method of claim 7, wherein the first electrode layer is disposed on the side of the pixel-defining layer away from the planarization layer by evaporation.

14. The method of claim 13, wherein an evaporation angle of evaporation ranges from 40° to 85°.

15. A display device, comprising a display panel, wherein the display panel comprises:
    an array substrate;
    an auxiliary electrode layer disposed on the array substrate;
    a passivation layer disposed on a side of the auxiliary electrode layer away from the array substrate, wherein a first through-hole is defined on the passivation layer;
    a planarization layer disposed on a side of the passivation layer away from the auxiliary layer, wherein a first connecting hole is defined on the planarization layer and is connected to the first through-hole;
    a metal line layer disposed on a side of the planarization layer away from the passivation layer and extending into the first connecting hole, wherein a first undercut structure is formed at a contact area between the metal line layer and the passivation layer near the first connecting hole;
    a pixel-defining layer disposed on a side of the planarization layer away from the passivation layer, wherein a first via is defined on the pixel-defining layer, the first via is connected to the first connecting hole, a second undercut structure is formed at a contact area between the pixel-defining layer and the metal line layer, and the second undercut structure is formed on an extending surface of a lateral wall of the first connecting hole; and a first electrode layer disposed on a side of the pixel-defining layer away from the planarization layer, wherein the first electrode layer comprises a first sub-electrode layer and a second sub-electrode layer, the first electrode layer is embedded into the first undercut structure by the first via, the first connecting hole, and the first through-hole and is connected to the auxiliary electrode layer, and the second sub-electrode layer is embedded into the second undercut structure by the first via and the first connecting hole and is connected to the metal line layer, and the metal line layer is connected to the first sub-electrode layer and the second sub-electrode layer.

16. The display device of claim 15, wherein a ratio of a height of the first undercut structure to a width of the first undercut structure is below 0.7, and a ratio of a height of the second undercut structure to a width of the second undercut structure is below 0.7.

17. The display device of claim 15, wherein a second through-hole is further defined on the passivation layer, a second connecting hole is further defined on the planarization layer, the second connecting hole is connected to the second through-hole, and the metal line layer is connected to the auxiliary electrode layer by the second connecting hole and the second through-hole.

18. The display device of claim 15, wherein an electrical resistance of the metal line layer is less than an electrical resistance of the first electrode layer.

19. The display device of claim 15, wherein a thickness of the metal line layer ranges from 1500 Å to 8000 Å.

20. The display device of claim 15, wherein the display panel comprises a source/drain metal layer, a second electrode layer, and a luminescent functional layer, a third connecting hole is further defined on the passivation layer and the planarization layer, the third connecting hole extends from a side of the source/drain metal layer away from the array substrate to a side of the planarization layer away from the array substrate, a second via is defined on the pixel-defining layer; and the source/drain metal layer and the auxiliary electrode layer are disposed on a same layer, the second electrode layer and the metal line layer are disposed on a same layer, the second electrode layer is connected to the source/drain metal layer by the third connecting hole, the luminescent functional layer is disposed on a side of the pixel-defining layer away from the array substrate, the luminescent functional layer is connected to the auxiliary electrode layer by the first through-hole, the first connecting hole, and the first via, the luminescent functional layer is connected to the second electrode layer by the second via, and the first electrode layer is disposed on a side of the luminescent functional layer away from the pixel-defining layer.

* * * * *